Oct. 31, 1961 A. M. GINDI 3,007,061

TRANSISTOR SWITCHING CIRCUIT

Filed May 8, 1959

INVENTOR
ABE M. GINDI

BY Arthur S. Tenser
ATTORNEY

United States Patent Office 3,007,061
Patented Oct. 31, 1961

3,007,061

TRANSISTOR SWITCHING CIRCUIT

Abe M. Gindi, Poughkeepsie, N.Y., assignor to International Business Machines Corporation, New York, N.Y., a corporation of New York Filed May 8, 1959, Ser. No. 811,844
3 Claims. (Cl. 307—88.5)

Figure 1:
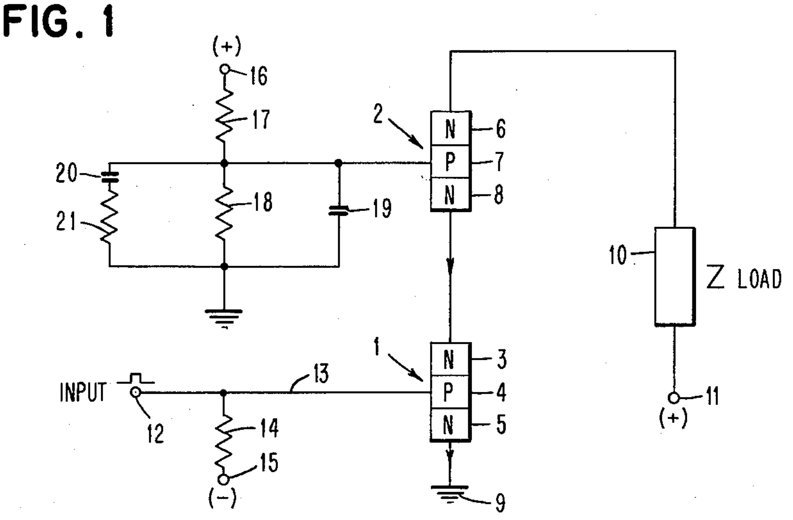

This invention relates to switching circuits, and more particularly to a transistor circuit for switching high voltage energy through a load.

Transistors are relatively low voltage devices as compared to vacuum tubes, and this characteristic provides one of their more important advantages. In building transistor circuitry, power supplies of the order of hundreds of volts are unnecessary, relatively inexpensive 20 to 30 volt power supplies being all that is required. There are occasions, however, in transistor circuitry where higher voltages are required to perform specialized operations. For example, in driving an inductive load, such as a relay or a series of magnetic cores, higher potentials are required to decrease the switching lag resulting from the inductive delay of the load. Another instance of the need for higher voltages is in the operation of neon indicators. Special transistors have been developed to withstand greater potentials, but these are extremely costly as compared to the standard, low voltage types. Heretofore, it has been necessary to use these expensive devices, or to resort to complicated circuitry, to accommodate higher potentials. To date, no satisfactory circuits utilizing stock transistors having low voltage breakdown limitations have been devised. The present invention makes it possible to use standard low voltage transistors in relatively high voltage switching applications to thereby effect a substantial savings in cost.

Accordingly, it is the principal object of this invention to provide a transistor circuit for switching voltages of magnitudes greater than those which the individual transistors are capable of withstanding.

It is a further object of this invention to provide such a transistor circuit utilizing a minimum of components.

Another object of this invention is to provide a transistor circuit capable of rapidly switching a high voltage supply to a load.

Briefly, the invention comprises a plurality of standard, low voltage transistors connected in series or cascode relationship, between reference potential and the load, each successive transistor providing the load impedance for the preceding transistor. The potential to be switched, which is greater than the breakdown potential of each of the individual transistors, is connected in series with the load. A switching signal is applied to the base of one of the transistors. The remainder of the transistors have individual time constant networks coupled to their respective bases. In the absence of a switching signal, all the transistors are non-conducting and the load voltage divides across the transistors. Upon application of a switching signal, all the transistors become conductive, the time constant networks insuring less-than-breakdown voltages across the transistors during the transition. At the termination of the switching signal, the transistors again become non-conducting and the time constant network prevents the voltages across the transistors from exceeding their breakdown levels during the transition back to non-conduction.

The foregoing and other objects, features and advantages of the invention will be apparent from the following more particular description of preferred embodiments of the invention, as illustrated in the accompanying drawings.

Figure 2:
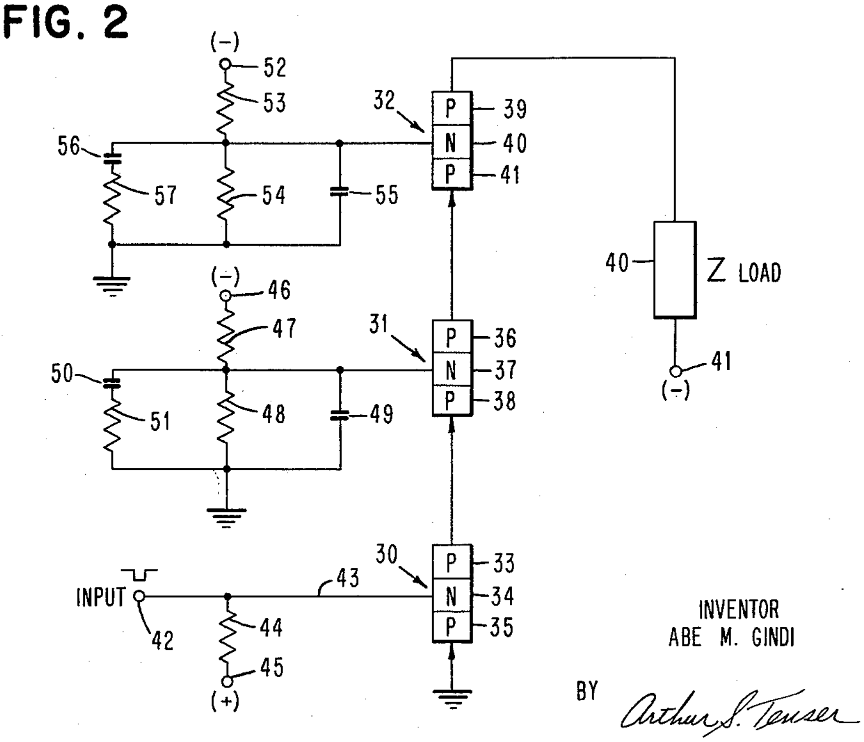

In the drawings:

FIG. 1 is a schematic diagram of a switching circuit according to the invention, and FIG. 2 is a schematic diagram of another circuit illustrating an extension of the principle of the invention.

Referring now to the drawings, FIG. 1 illustrates one of the preferred embodiments of the invention. Transistors 1 and 2 are shown as being of the NPN junction type although, as will be seen with respect to FIG. 2, other suitable types of transistors may be used. Transistor 1 has a collector 3, a base 4 and an emitter 5. Similar elements of transistor 2 are shown at 6, 7 and 8 respectively. Emitter 5 of transistor 1 is returned directly to reference potential 9 while its collector 3 is connected directly to emitter 8 of transistor 2. Collector 6 of transistor 2 is connected to one side of the load 10, the other side of which is connected to a source of positive supply potential 11, the potential to be switched to the load 10. The switching signal input is applied at terminal 12 and over conductor 13 to the base 4 of transistor 1. Resistor 14 and negative potential source 15 maintain a negative bias on the base 4 to keep transistor 1 non-conducting in the absence of an input signal. The base 7 of transistor 2 is connected to the mid-point of a voltage divider comprising resistors 17 and 18 in series. The upper terminal of resistor 17 is connected to a source of positive potential 16 and the lower terminal of resistor 18 is tied to reference potential. Capacitor 19 is connected in parallel with resistor 18, as is the series combination of capacitor 20 and resistor 21. The load 10 may take any form and is shown merely as a block having an impedance $Z_{load}$.

Operation of the circuit is as follows. In the absence of an input signal, transistor 1 is biassed off by virtue of the negative potential from source 15. Since this transistor is non-conducting, no current can flow in the path comprising transistor 1, transistor 2 and the load 10. Voltage source 16 is of the same magnitude as supply source 11 and in practice may be the same source. Resistors 17 and 18 are made equal to each other whereby in the non-conducting state, a potential equal to half the potential to be switched is placed on the base 7 of transistor 2. Assuming the circuit to have been non-conducting for a period of time, the capacitors 19 and 20 will be fully charged to a value equal to one half of the potential available at 16. Since in the non-conducting condition the base current of the transistor 2 will be negligible, the voltage at its emitter 8 will be the same as that at its base. This results in a voltage equal to one half the supply voltage being applied at collector 3 of transistor 1. It will be seen then that in the Off or non-conducting condition, the collector of transistor 2 is at the potential of source 11, the base and emitter of transistor 2 and the collector of transistor 1 are at a potential equal to one half the value of the potential of source 11, and the emitter of transistor 1 is at reference potential. Since the transistors are selected to have a breakdown potential somewhat greater than one-half of the potential to be switched, it is apparent that the breakdown potential of neither transistor is exceeded while in the Off condition.

When a positive going pulse is applied to the base 4 of transistor 1, its base-emitter junction becomes forward biassed and the transistor conducts, dropping its impedance to a negligible value. The collector 3 drops in potential towards reference potential whereby the base-emitter junction 7, 8 of transistor 2 becomes forward biassed and substantial base current begins to flow therein. This will tend to drop the potential at base 7 also. Collector 6 however, does not follow any potential drop of base 7 immediately because of the turn on delay and transition of the transistor. This time lag results from the transit time of electrons across the base region 7 and the fact that not all electrons will traverse this base region in the same time. This time lag is likewise present in PNP transistors. For a short time therefore, a potential greater than one half of this supply potential would be applied across transistor 2, which would endanger the transistor if capacitor 19 was not present. Upon conduction of the base-emitter junction of transistor 1 however, capacitor 19, which had previously been charged up to a potential equal to one half the potential at 11, has a discharge path through the circuit comprising base 7 and emitter 8 of transistor 2 and transistor 1. The size of capacitor 19 is so chosen that its time constant with the resistance of the above described discharge path will delay its discharge for a time that will compensate for the turn on time lag of transistor 2. This will maintain one half of supply potential at base 7 for a sufficient length of time after conduction across its base-emitter junction to prevent potentials sufficient to cause breakdown from appearing across the transistor. When capacitor 19 is discharged, full conduction of transistors 1 and 2 is established. Since the impedance of the transistors 1 and 2 in their full conduction, or saturation, condition is relatively negligible, the supply potential 11 is substantially completely across the load impedance 10. Capacitor 20 is made very large with respect to capacitor 19 whereby it loses very little charge during the On or conducting time of the circuit.

When the input signal goes negative, conduction through transistor 1 and emitter 8 of transistor 2 ceases. The potential at the junction of collector 3 and emitter 8 begins to rise to reverse bias the base-emitter junction of transistor 2 and render it non-conductive. As in the turn on case, a time lag occurs during the turn off transition of transistor 2, equal to the time necessary for all the free electrons in the base region to reach the collector. To prevent excessive voltages from appearing across the transistor during this interval, it is necessary that the potential at base 7, which will be determined by the charge on capacitor 19, rise at a rate such that the potential across the collector-base junction will always be within its rated value. Since transistor 1 is at this time a very high impedance, the charging time of capacitor 19 will depend primarily on the external circuit elements coupled thereto. In some instances, depending upon the characteristics of the particular transistors used, the time constant of the circuit comprising capacitor 19 and resistors 17 and 18 may be small enough to cause the potential at the base 7 to rise at the proper rate. However, since this may not always be possible, capacitor 20 and resistor 21 are provided. As previously noted, capacitor 20 is large with respect to capacitor 19 and lost little of its charge during the On time of the circuit. Accordingly, during the turn off transition, capacitor 20 discharges into capacitor 19 to materially speed up the charge time of the latter capacitor. The potential at base 7 therefore, rises at a rate equal to or greater than that at collector 6 and breakdown potential across the transistor 2 is never present. It will be appreciated that under certain conditions, elements 20 and 21 may be eliminated and the voltage rise at base 7 may be adequately controlled by resistors 17, 18 and capacitor 19.

It is apparent from the above description that by means of the novel circuit described therein, stock transistors having relatively low breakdown potentials can be used to switch potentials approximately twice as great as that which the transistors can individually withstand. By means of the resistance-capacitance network connected to the base of transistor 2, any possibility of exceeding the breakdown potential during the operation of the switching circuit is avoided. Thus, higher voltages may be switched without the necessity of using specially made and costly high voltage transistors. The particular arrangement described also enables the switching to be accomplished at a rapid speed. Since collector 3 of transistor 1 is tied directly to the emitter 8 of transistor 2 in cascode relationship, the switching action of the latter commences immediately as the collector voltage of transistor 1 begins to drop. Thus, the turn on and turn off transition times of the two transisors are overlapping rather than successive. The total switching time therefore approaches that which would be occasioned by a single transistor.

The principle employed in the circuit of FIG. 1 can be extended to increase the maximum voltage to be switched. This is illustrated by the embodiment of FIG. 2, wherein three transistors are connected in series to switch a potential having a magnitude of the order of three times the breakdown potential of an individual transistor. As shown, the circuit comprises three transistors 30, 31 and 32, which are shown as being of the PNP junction type. It will be evident such as from consideration of FIG. 1, that other types of transistors may be used. Transistor 30 has its emitter 35 tied directly to reference potential 39 and its base 34 connected via conductor 43 to input terminal 42. Positive potential source 45 and resistor 44 connected to conductor 43 back bias the base-emitter junction of transistor 30 to maintain the transistor non-conducting in the absence of an input signal. The collector 33 of transistor 30 is connected directly to the emitter 38 of transistor 31 whose collector 36 is in turn, connected directly to the emitter 41 of transistor 32. To base 37 of transistor 31 is coupled a network similar to that coupled to the base of transistor 2 of FIG. 1. This network comprises a source of negative potential 46 connected through series resistors 47 and 48 to reference potential. Capacitor 49 is connected across resistor 48 as is the series combination of capacitor 50 and resistor 51. The circuit is coupled to the base of transistor 31 at the junction of resistors 47 and 48. A similar network is connected to the base 40 of transistor 32. This network comprises negative potential sources 52 and resistors 53 and 54 in series between said source and reference potential. The common point of these two resistances is coupled to the base 40. Capacitor 55 is connected across the resistor 54. Likewise, the series combination of capacitor 56 and resistor 57 is connected in parallel with resistor 54. The collector 39 of transistor 32 is connected to one side of the load 40, the other side of which is connected to the negative potential supply source 41.

Voltage sources 46, 52 and 41 are of the same magnitude and polarity and in practice would be one source. Resistor 47 is made twice as large as resistor 48 whereby a potential approximately equal to one third of the potential of 46 is maintained at the base 37 of transistor 31. As explained in connection with FIG. 1, the potential of the base of transistor 31 will be present also at the collector 33 of transistor 30. Therefore, in the non-conducting condition, transistor 30 has across it a potential equal to one third of the supply potential. On the other hand, resistor 53 is made equal to one half the value of resistor 54 whereby a potential approximately equal to two thirds of the potential at 52 is applied to the base 40 of transistor 32. This value of potential will then appear at the emitter 41 of transistor 32 and the collector 36 of transistor 31. It will be seen then that a voltage equal to one third of the supply voltage will appear across transistor 31 and a similar voltage will appear across transistor 32. In the non-conducting condition then, each transistor has across it a potential equal to one third of the supply potential. The transistors 30, 31 and 32 are selected to have breakdown potential somewhat in excess of one third of the supply potential so that no danger of breakdown will be present.

The operation as between any two successive transistors of the circuit of FIG. 2 will be identical to that described in connection with FIG. 1. Thus, as transistor 30 is rendered conductive by a negative input applied at terminal 42, its collector rises in potential toward the reference level, thereby forward biassing the base-emitter junction of transistor 31. This, in turn, operates to render transistor 31 conductive. However, capacitor 49 delays the rise in potential at base 37 a short time to compensate for the turn on time lag of 31 and thereby prevent a greater than breakdown potential from appearing across the transistor. As collector 36 begins to rise toward reference potential, transistor 32 becomes conductive. In this instance, capacitor 55 prevents a voltage greater than breakdown from appearing across transistor 32 during its turn on transition. When all three transistors are fully conductive, substantially the entire supply voltage 41 appears across the load impedance 40.

The turn off operation is accomplished in the same manner as described in connection with FIG. 1. The charging of capacitor 49 is aided by the charge on capacitor 50 which is large in comparison thereto. The relation between the elements is the same as that discussed above in connection with capacitors 20 and 19. Similar operation results between capacitors 55 and 56 at transistor 32. Thus, equal voltages across the transistors are maintained during the turn off transition and breakdown potentials across any of the transistors is avoided. Here also, because the turn on and turn off operation of the three transistors are overlapping rather than successive, the total turn on and turn off times of the circuit are held to a minimum, closely approaching the turn on and turn off times of a single transistor.

By means of the above described circuitry it is possible to use standard, low voltage transistors to switch relatively high voltages through a load. This eliminates the necessity for costly high voltage transistors without materially increasing the switching times. It will be realized of course, that any number of transistors may be connected in cascode in accordance with the invention to accommodate different magnitude of supply potential. As is apparent in either the circuit of FIG. 1 or of FIG. 2, other types of transistors may be used with suitable changes in potentials. It is also apparent that the transistors in each circuit need not have the same breakdown potentials, it being necessary only to provide proper potentials at the bases in the Off condition to accommodate the varying characteristics.

It is believed obvious that if proper voltage levels are available, it will be possible to simplify the circuits of FIGS. 1 and 2 by eliminating the voltage dividers used to derive the required potentials. In such a case, the proper voltage level may be applied through a delay network, consisting of a capacitor and resistor in parallel, to the base of the associated transistor and operation of the circuit would be the same as described above.

While the invention has been particularly shown and described with reference to preferred embodiments thereof, it will be understood by those skilled in the art that various changes in form and details may be made therein without departing from the spirit and scope of the invention.

What is claimed is:

1. A circuit for connecting a voltage source to a load comprising, a plurality of transistors, each having an emitter, a collector and a base and capable of withstanding a maximum potential less than that of said voltage source, means connecting said transistors in cascode relationship between said load and said voltage source, a source of switching signals coupled to the base of one of said transistors, and a plurality of delay networks, one coupled to the base of each of the remaining transistors of said plurality, each of said delay networks comprising a fixed potential source having the same magnitude and polarity as said voltage source, a pair of resistive impedances connected in series across said potential source, and a capacitor connected in parallel across one of said resistive impedances, the junction of said capacitor and said pair of impedances being coupled to the base of the respective transistor.

2. The circuit of claim 1 above wherein each of said delay networks further comprises an additional capacitor and a resistor in series connected across said first mentioned capacitor, the capacitance of said additional capacitor being large compared to that of said first mentioned capacitor.

3. A circuit for connecting a potential source to a load comprising, a plurality of transistors, each having an emitter, a collector, and a base, each of said transistors having an emitter-to-collector breakdown voltage less than the magnitude of said potential source, means connecting said transistors in cascode relationship with each other and with said potential source and said load to form a single current conducting loop, means for applying a switching signal to the base of one of said transistors, and means for providing a fixed bias for each of the remainder of said transistors, said last named means including for each transistor, a source of fixed potential having a pair of terminals, means connecting one terminal of said fixed potential source to the base of its associated transistor to maintain the potential across said transistor below its breakdown voltage in the nonconducting condition, and delay means connected between the terminals of said fixed potential source to maintain the bias potential level at said base for a predetermined time after application of said switching signal to said one transistor.

References Cited in the file of this patent

UNITED STATES PATENTS 2,831,126 Linvill ---------------- Apr. 15, 1958

FOREIGN PATENTS 216,255 Australia -------------- July 24, 1958

OTHER REFERENCES

"A Basic Transistor Circuit for the Construction of Digital-Computing Systems," by Cloot, the Proceeding of the Institute Electrical Engineering, May 1958, vol. 105, part B, No. 21, page 214.